United States Patent
Higashiho et al.

(10) Patent No.: US 6,351,432 B1
(45) Date of Patent: Feb. 26, 2002

(54) SYNCHRONOUS SEMICONDUCTOR MEMORY APPARATUS AND INPUT INFORMATION LATCH CONTROL METHOD THEREOF

(75) Inventors: Mitsuhiro Higashiho; Shigemasa Ito, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/904,479

(22) Filed: Jul. 16, 2001

(30) Foreign Application Priority Data

Sep. 4, 2000 (JP) ........................................ 2000-266889

(51) Int. Cl.[7] ................................................ G11C 8/06
(52) U.S. Cl. .................. 365/230.08; 365/233; 365/195; 365/193; 365/191; 365/189.08; 365/189.11; 365/189.05; 365/189.07
(58) Field of Search ................................. 365/233, 193, 365/191, 189.08, 230.08, 230.03, 195, 189.11, 189.05, 189.07, 227, 226

(56) References Cited

U.S. PATENT DOCUMENTS 5,754,838 A * 5/1998 Shibata et al. ............... 713/600
6,192,003 B1 * 2/2001 Ohta et al. .................. 365/233
6,240,048 B1 * 5/2001 Matsubara .................. 365/233
6,256,260 B1 * 7/2001 Shim et al. ................. 365/233

FOREIGN PATENT DOCUMENTS

| JP | 7-177015 | 7/1995 | ....... H03K/19/0175 |
| JP | 11-273341 | 10/1999 | ......... G11C/11/407 |

* cited by examiner

*Primary Examiner*—Andrew Q. Tran
(74) *Attorney, Agent, or Firm*—Arent Fox Kintner Plotkin & Kahn, PLLC

(57) ABSTRACT

A synchronous semiconductor memory apparatus is capable of activating an input buffer circuit only in a required operating cycle and achieving low current consumption without degrading high speed response properties of an input buffer. When combination of control signals (Control) such as /CS, /RAS, /CAS, /WE and the like is directed to active command (ACTV), read command (READ, READA), write command (WRITE, WRITEA), mode register command (MRS), pre-charge command (PRE) and the like, a latch operation is dynamically performed for input from address pins. In this way, in the case where a signal iRAS is set at a low level, a latch signal aCLK is output to the rising edge of a signal iCLK, thereby latching addresses Add or the like. Alternatively, in the case where a signal iRAS or iCAS is set at a low level, the latch signal aCLK is output to the rising edge of the signal iCLK, thereby latching addresses Add or the like.

15 Claims, 14 Drawing Sheets

SYNCHRONOUS SEMICONDUCTOR MEMORY APPARATUS AND INPUT INFORMATION LATCH CONTROL METHOD THEREOF

BACKGROUND OF THE INVENTION

1. Field of the Invention

The present invention relates to a synchronous semiconductor memory apparatus comprising a latch circuit for latching an output of an input circuit that receives input information.

In particular, the present invention relates to a synchronous semiconductor memory apparatus comprising a latch circuit capable of reducing current consumption and an input information latch control method thereof.

2. Description of Related Art

In recent years, in a semiconductor storage apparatus, with improvement in processing capability of a personal computer or the like, there has been a strong demand for high speed data access, and a synchronous semiconductor memory apparatus for data input/output in synchronism with an external clock has been significantly advanced and developed. At the same time, there has been remarkable improvement in technique for hand held device. In a semiconductor storage apparatus as well, lower current consumption is expected. In a typical product field, a hand held device having its high level computing capability such as mobile personal computer (PC) or notebook type personal computer (PC) has been significantly developed. As a semiconductor storage apparatus to be mounted on such device, a synchronous semiconductor memory apparatus are required which are capable of achieving an operation for low current compensation represented by a synchronous dynamic random access memory. Approaches for low current consumption includes a variety of measures described later, including control that has been achieved in a system inactive state such as power-down mode.

FIG. 1 is a circuit block diagram depicting an input buffer circuit that receives a signal from an external pin. A variety of control signals (Control) such as /CS,/RAS,/CAS,/WE or the like, bank address BankAdd or address Add, and data DQ or write mask signal DQM and the like are input to the external pin, and a level converter circuit (Level Converter) (refer to FIG. 15) detects whether a voltage level of an input signal is high or low comparing with a predetermined reference voltage Vrf. Then, this voltage level is converted into an amplification level of an internal circuit. This circuit is provided in a differential amplifier circuit system as shown in FIG. 15, and can be composed of a CMOS logic circuit or the like. The level converted input signal is level converted by means of a level converter circuit (Level Converter), and is latched by means of a latch circuit (Latch) (refer to FIG. 16) in synchronism with a rising edge of an internal synchronous clock (int. CLK) in which driving capability is improved by means of a driver circuit (Driver), thereby determining setup and hold specifications for a signal utilized for an internal circuit (Int. Circuit) and applied to an external pin.

Here, let us take an example of a 64 megabit synchronous semiconductor memory apparatus. A set of address Add is composed of 14 bits including 1 bit of bank address BankAdd, and a set of data DQ is composed of 32 DQs. With further high capacity and an increased number of DQs, the number of input buffer circuits represented by a set of address BankAdd, Add, and a set of data DQ is prone to increase.

FIG. 2 is a diagram showing operating waveforms. In synchronism with a rising edge of an internal synchronous signal int. CLK that is a signal in the same phase as a synchronous signal CLK, all latch circuits (Latch) performs latch operation, thereby performing a latch operation of the bank address BankAdd and row addresses in an active command (ACTV) cycle in FIG. 2. In FIG. 2, latch operation is performed in each cycle. In a current state in which a plenty of pins are provided, low current consumption in an input buffer circuit is an important factor, and a variety of measures are discussed and taken.

For example, in Japanese Laid-open Patent Publication No. 11-273341 that is the first prior art, in a clock synchronous semiconductor apparatus, as shown in FIG. 3, an input buffer 100 is composed of: a differential input buffer 101; a latch circuit 102 for latching a differential input buffer output; and a control circuit 103 for activating the differential input buffer 101 and the latch circuit 102 only at a predetermined timing.

That is, in the control circuit 103, when both of the power-down signal PD and latch signal QCLKB are inactive (low level), the differential input buffer 101 and the latch circuit 102 are activated. Then, a voltage level of an external input signal IN compared with a reference voltage Vref is differentially amplified at a differential input buffer 101, and is level converted as an output signal. Thereafter, a data holding operation is performed at the latch circuit 102. When at least one of the power-down signal PD and latch signal QCLKB is active (high level), an output NOR101 of the control circuit 103 turns OFF an NMOS transistor Q106. A signal obtained by inverting the output NOR101 by means of an inverter IV turns OFF a PMOS transistor Q105, and turns OFF a clocked inverter CIV that configures the latch circuit 102. Thus, a bias current of the differential input buffer 101 and a through current when data is switched in the latch circuit 102 do not flow altogether.

Therefore, in a normal operating state in which the power-down signal PD is inactive (low level), a latch signal QCLKB is inactive (low level) for a predetermined time in synchronism with a synchronous signal (clock) by which data is input, and is active (high level) in the subsequent latch period, whereby current consumption in an input data latch state is reduced.

In addition, in Japanese Laid-open Patent Publication No. 7-177015 that is the second prior art, in a synchronous semiconductor apparatus configuring two banks A and B, as shown in FIG. 4, when burst reading is performed in a bank selection state, the supply of a bias current to an input circuit at an initial stage is stopped.

That is, in the case where either one of the bank selection signals (signal ARAE for bank A and signal BRAE for bank B) enters a high level, and is selected (OR logic gate 201); a burst read signal READB enters a high level and a burst read state (OR logic gate 202); and a power-down signal PWDNB enters a low level, and is in a normal operating state, an output signal PWDNB2 obtained by inverting a logical product (NAND logic gate 203) of these signals (by an inverter 204) enters a high level. This output signal PWDNB2 is inverted by means of an inverter 205, and bias PMOS transistors 206 and 207 of an input circuit at an initial stage are turned OFF, thereby stopping the supply of a bias current to the input circuit at the initial stage.

In addition, the timing chart in the figure denotes a 4-bit burst read in bank A. Prior to cycle T1, when /RAS is set at a low level, and a bank A active command is recognized at a rising edge of a synchronous clock CLK at cycle T1, a bank A selection signal ARAE goes to a high level in cycle T1. Next, in cycle T1, /RAS goes to a high level, and /CAS goes to a low level. In cycle T2, a bank A read command is recognized. In cycle T2, a burst read signal READB goes to a low level. At this time, assuming that an output enable mask signal OEMSK maintains a low level, a signal PWDNB2 goes to a low level. In the subsequent cycle as well, a burst read operation is performed while a low level is maintained (T3 to T6).

Therefore, after a burst bank A selection signal ARAE goes to a high level in cycle T1, a signal PWDNB2 maintains a low level excluding a startup period of a burst read operation until the burst read signal READB goes to a low level in the subsequent cycle T2. Then, the power of an input circuit at the initial stage is cut in order to reduce current consumption.

Although a bank A burst read operation has been described above, of course, the similar operation is made for bank B.

In Japanese Laid-open Patent Publication No. 11-273341 that is the first prior art, the activation period of the input buffer 100 is limited to a predetermined time from a falling edge of a synchronous clock. However, in order to enable operation in all the clock cycles, as shown in FIG. 2, in the case where a potential state of an external pin is unstable instead of a cycle of inputting addresses or data and the like (DSEL, NOP in FIG. 2) as well, a command acquisition operation is performed. Thus, there is a problem that there flow currents such as a bias current of an unnecessary differential input buffer 101, a through current during inversion data latching in the latch circuit 102, and further, a charging/discharging current of an internal signal line during data inversion, and current consumption cannot be reduced.

Here, a cycle in which a command or the like is not input denotes a wait cycle (NOP cycle) in which, for example, in the case where an active command is accepted, a read operation cannot be performed for a time in which data is read out from a memory cell as an internal operation, and amplified by means of a sensing amplifier, and thus, in the case where a synchronous clock frequency is particularly at a high speed, data can be read out from an active command to a read command. In this non-operation (NOP) cycle, data stored in a memory cell is amplified by means of a sensing amplifier. Although a command or the like from an external pin cannot be accepted, a synchronous clock is input to an input buffer 100. Thus, since input signal level conversion and latch operation are performed, wasteful current consumption is generated, and current consumption cannot be reduced, which is problematic.

Further, a bank A pre-charge command is accepted at the end of a burst read operation. However, in this case, a required address is only a bank address for specifying a bank. Although a normal address is unnecessary, all the input buffers 100 for inputting addresses are activated. Thus, with respect to such unnecessary addresses, level conversion and latch operation are performed. Thus, wasteful current consumption is generated, and current consumption cannot be reduced, which is problematic.

An input buffer 100 in which the supply of a bias current is stopped at the end of a clock cycle, and operation is stopped, must start the supply of a bias current at the rising edge or falling edge of a synchronous clock in the next cycle, and acquire a command or the like. In a current state in which specifications for setup and hold times of commands or the like are severe with high speed operation, the supply of the bias current and command acquisition prevent high speed operation, which is problematic.

In addition, in Japanese Laid-open Patent Publication No. 7-177015 that is the second prior art, a bias current is supplied to an input current at the initial stage by means of bank selection signals ARAE and BRAE activated based on a command for accepting at the rising edge of the synchronous clock. The number of logic gate stages from the rising edge of the synchronous clock to activation of the bank selection signals ARAE and BRAE requires some ten stages. Thus, there is a problem that its propagation delay cannot conform to specifications for setup and hold times of an input signal, and the activation of an input circuit at the initial stage for inputting data or address and the like is delayed in accordance with a cycle of a synchronous clock for activating the input circuit at the initial stage. Therefore, the prior art is limited to application to the input circuit at the initial stage which does not require signal acquisition at the same cycle as bank activation command, and is limited to reduction of current consumption, which is problematic.

In addition, in the timing chart shown in FIG. 4, although the cycle of a bank A active command and a cycle of a read command are adjacent, a semiconductor storage apparatus receiving a bank A active command reads out data from the memory cell and performs amplifying operation at the sensing amplifier, making it necessary to be ready for a read command at the next step. In the case where an amplifying operation at the sensing amplifier can be executed at one synchronous clock cycle from data readout from the memory cell, a read command can be executed from the bank A active command at a continuous clock cycle, as shown in the timing chart of FIG. 4. However, in a current state in which speeding up synchronous clock is advanced with high speed operation in recent years, a time required for internal amplifying operation requires synchronous clock cycle or more, thus making it necessary to insert a non-operation (NOP) cycle until the read command is obtained. The required number of non-operation (NOP) cycles is prone to increase with higher synchronous clock cycle. In the prior art shown in FIG. 4, during this non-operation (NOP) cycle period, an input circuit at the initial stage is activated. Thus, unnecessary operation of the input circuit at the initial stage increases with advancement for high speed operation, and current consumption cannot be reduced, which is problematic.

SUMMARY OF THE INVENTION

The present invention has been made in order to solve the foregoing problem. It is an object of the present invention to provide a synchronous semiconductor memory apparatus in which an input buffer circuit is activated only at a required operating cycle without degrading input buffer high speed response properties, whereby unnecessary current consumption can be reduced, and low current consumption can be achieved while high speed response properties relevant to an input signal is maintained.

In order to achieve the foregoing object, according to one aspect of the present invention, there is provided a synchronous semiconductor memory apparatus, comprising: a first input circuit receiving a synchronous signal; one or more second input circuits receiving a control signal; and third input circuits for an access to individual memory cells; and first latch circuits for latching output signals of the third input circuits according to an output signal of a logic circuit receiving an output signal from the first input circuit and one or more second input circuits.

In addition, according to one aspect of the present invention, there is provided a method for latching and controlling input information on a synchronous semiconductor memory apparatus, comprising the steps of: inputting a synchronous signal, one or more control signals, and information required for access to individual memory cells; the synchronous signal input step; and the first latch step of latching output signals obtained from the information input step according to an output signal obtained from the logic step of inputting an output signal obtained from the control signal input step.

In the synchronous semiconductor memory apparatus and a method for latching and controlling input information on the synchronous semiconductor memory apparatus, information required for memory access is latched according to the output result logically computed based on a logic relationship between the synchronous signal and one or more control signals.

In this manner, in the case where an output signal of the third input circuit for inputting input information such as address or data or the like required for access to a memory cell is latched by means of the first latch circuit only according to a logical relationship obtained as an output signal of a logic circuit for inputting a synchronous signal that is an output signal of the first input circuit and one or more control signals input to the second input circuit, and in the case where a logic circuit does not output an output signal because a control signal does not coincide with a predetermined logical relationship, no latch operation is performed. This, a latch operation can be performed only in the case where there exists a signal to be input to an input terminal of the third input circuit. When a signal level is unstable, latch data inversion due to unnecessary latch operation caused by a synchronous signal does not occur. In a normal operating state, latch operation can be dynamically performed for each operating cycle, and there does not occur current consumption of a through current or the like of a latch circuit caused by data inversion due to unnecessary latch operation or current consumption caused by charge and discharge operations of an output signal line in a latch circuit.

In addition, a latch circuit is controlled by means of an output signal of a logic circuit instead of the synchronous signal. Thus, a load on a signal line connected to an output signal of the first input circuit can be reduced, and current consumption when the synchronous signal is driven can be reduced.

Further, low current consumption can be accelerated while an active state is maintained without performing control for activation of the first to third input circuits, and thus, low current consumption can be achieved without preventing high speed response properties relevant to an input signal.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principle of the present invention.

DETAILED DESCRIPTION OF THE INVENTION

Figure 1:
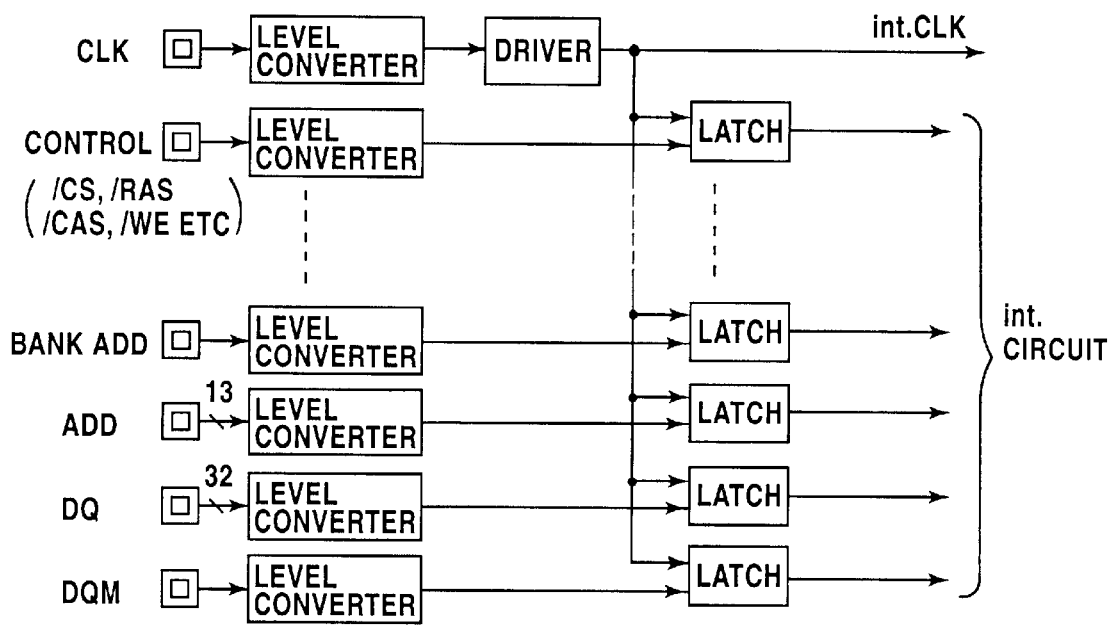
FIG. 1 is a block diagram depicting an input buffer circuit in the prior art.
Figure 2:
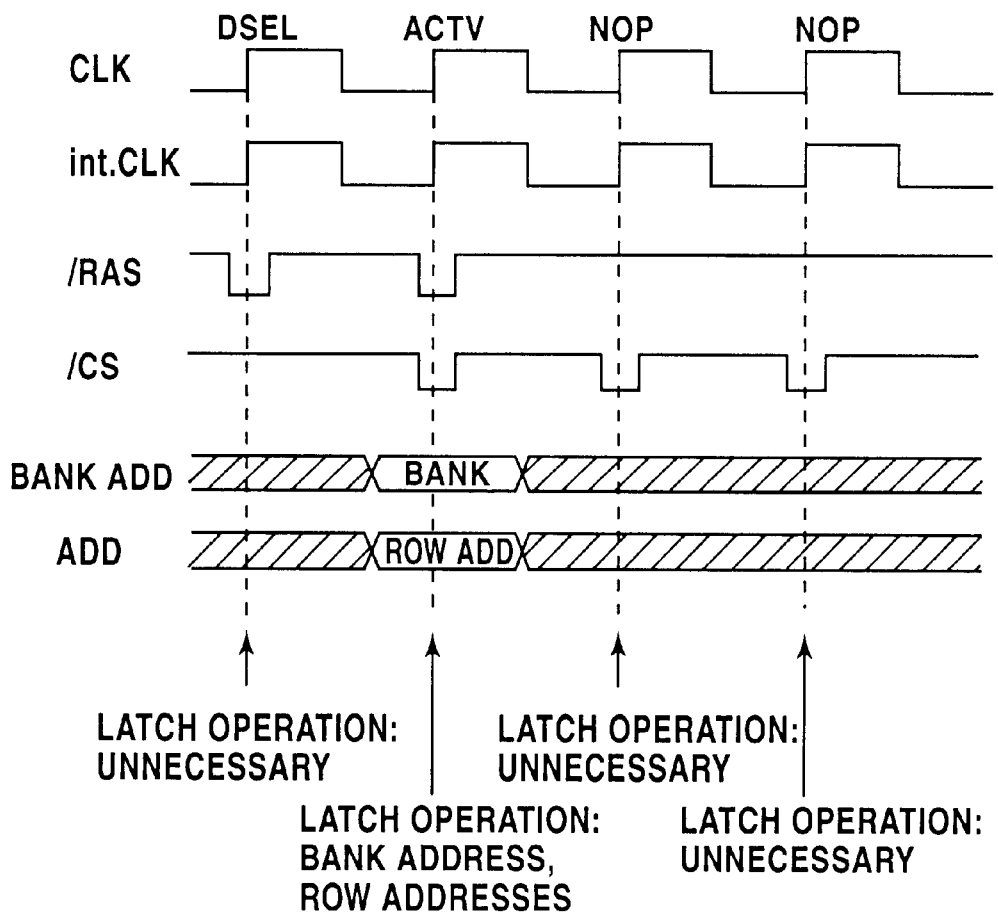
FIG. 2 is an operating waveform diagram of an input buffer circuit in the prior art.
Figure 3:
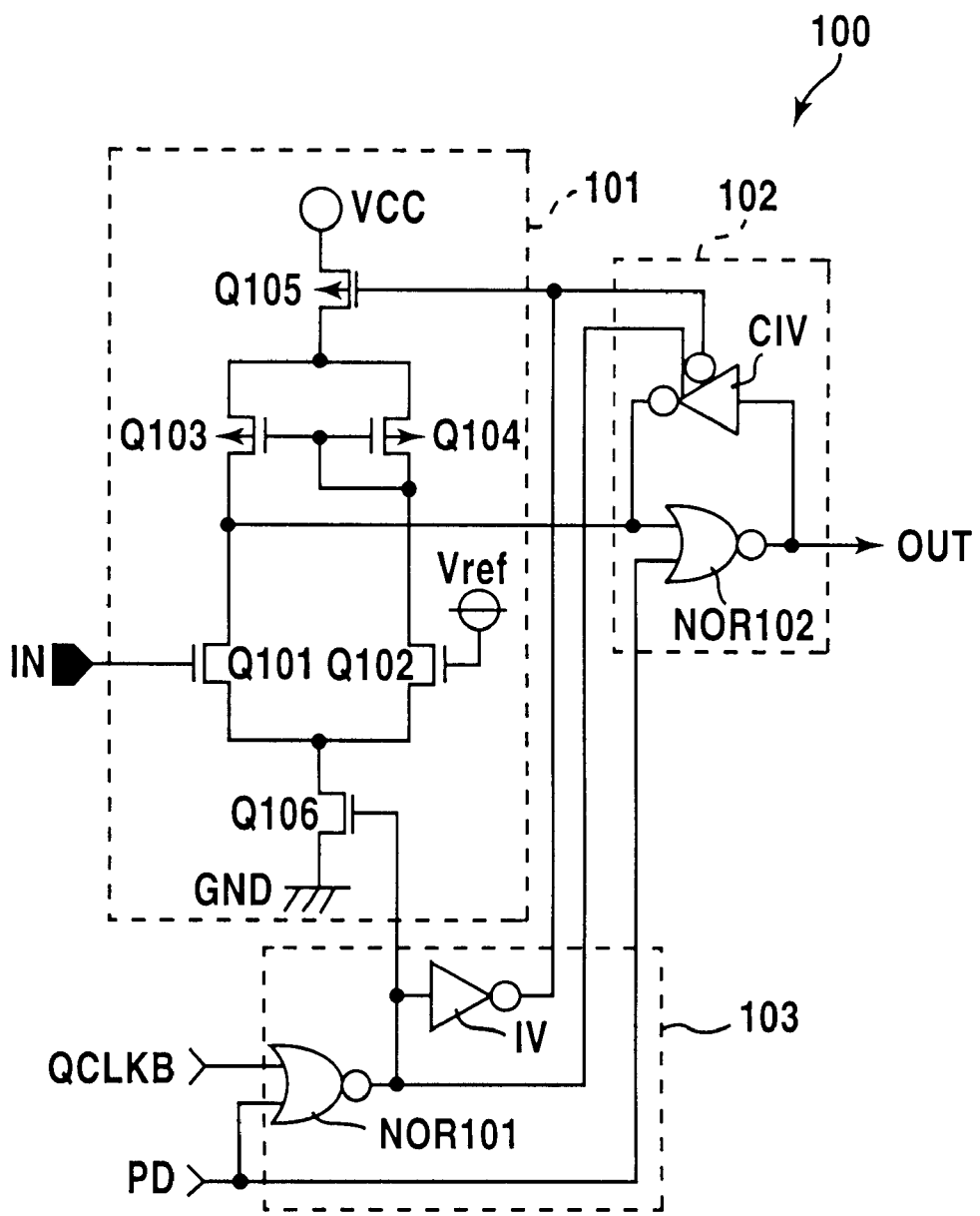
FIG. 3 shows an input buffer circuit in a first conventional example.
Figure 4:
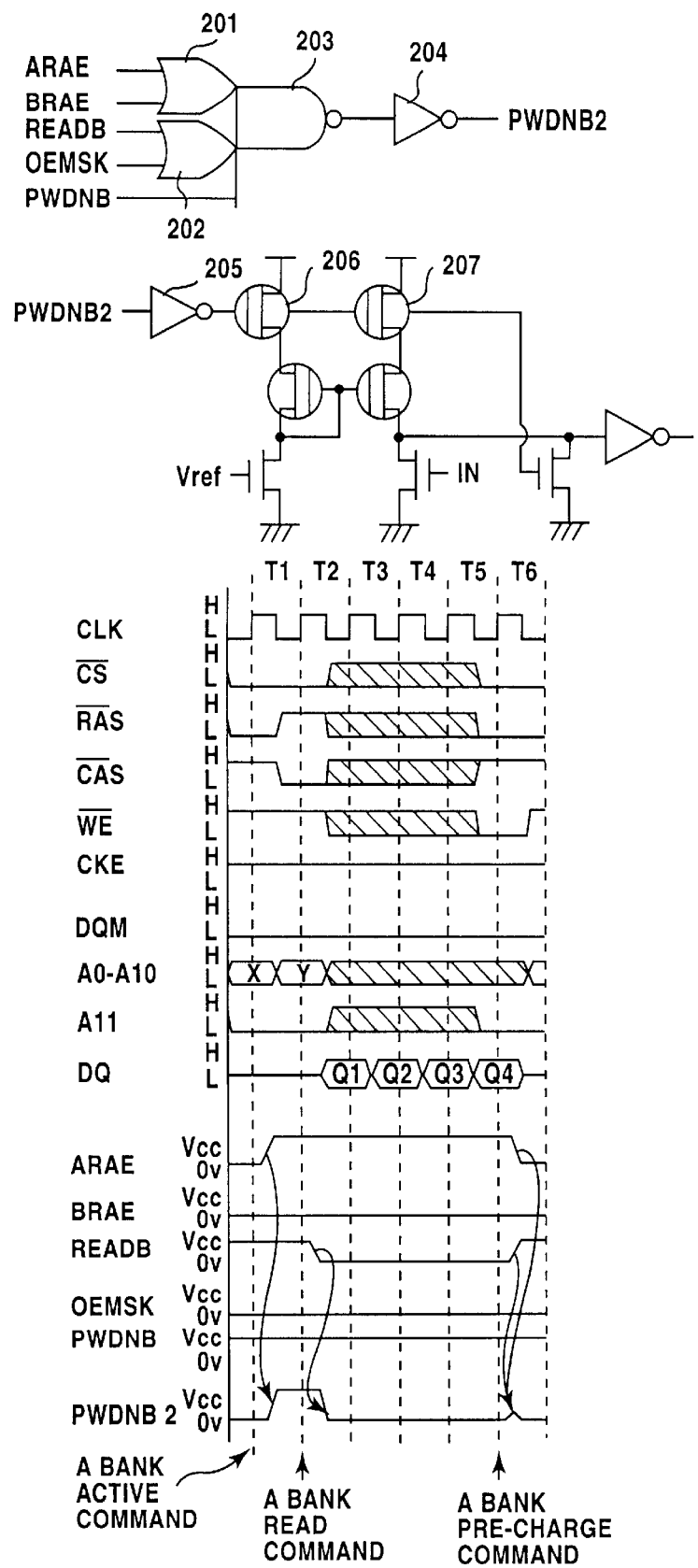
FIG. 4 shows an input circuit at an initial stage in a second conventional example.

Reference will now be made in detail to the presently preferred embodiments of the invention as illustrated in the accompanying drawings, in which like reference numerals designate like or corresponding parts.

Hereinafter, a synchronous semiconductor memory apparatus and a method for latching and controlling input information on the synchronous semiconductor memory apparatus according to the present invention will be described in detail with reference to the accompanying drawings by way of first to third embodiments embodied in a 64 megabit synchronous random access memory (SDRAM).

Figure 5:
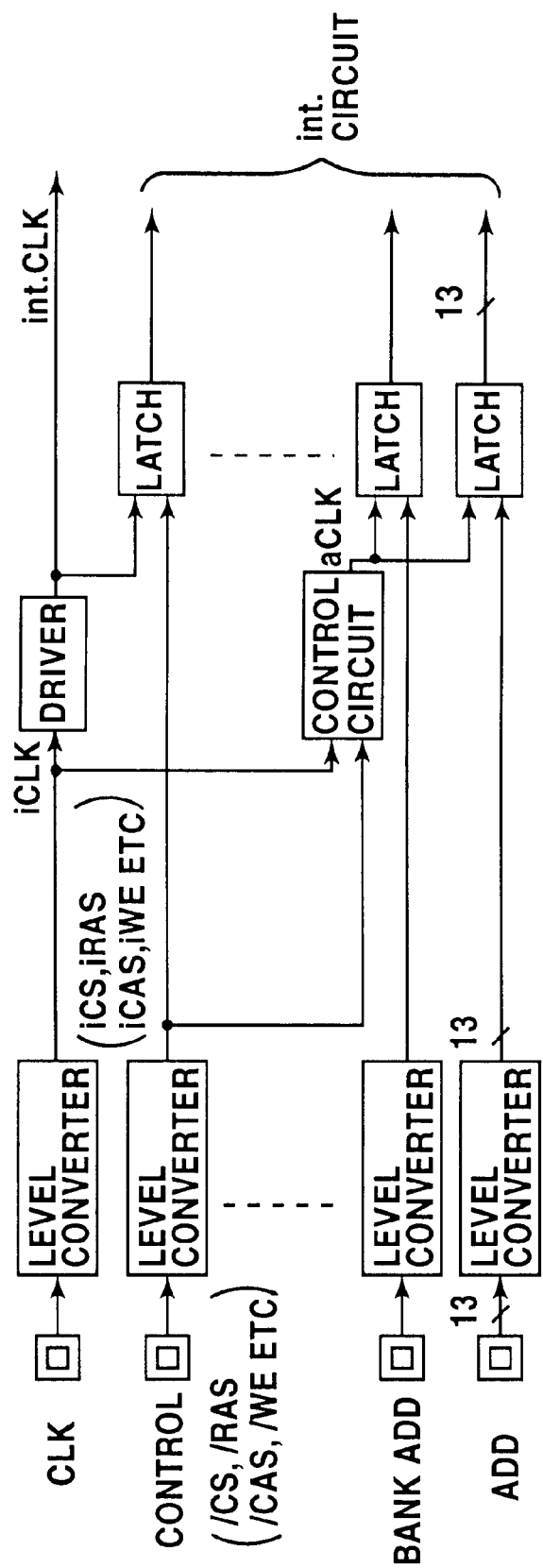
FIG. 5 is a block diagram depicting an input buffer circuit in a first embodiment.

A first embodiment in FIG. 5 is arranged to latch output signals of an input circuit (Level Converter) of a bank address BankAdd and an input circuit (Level Converter) of addresses Add, as contrasted with the prior art shown in FIG. 1, by means of an output signal of a control logic circuit (Control Circuit). In a circuit block having its configuration similar to the prior art, like elements are designated by like reference numerals. A description is omitted here.

A control logic circuit (Control Circuit) inputs iCLK, iCS, iRAS, iCAS, iWE and the like as level-converted signals of synchronous signal CLK, control signals /CS, /RAS, /CAS, /WE, respectively, wherein level converted signals are obtained by level converter circuit (Level Converter). Then, the Control Circuit outputs a signal aCLK as a latch signal obtained by logically computing those signals in a logic circuit configuration described later. Further, a latch circuit (Latch) latches a bank address BankAdd and a set of address Add by means of a latch signal aCLK. Here, as a latch circuit (Latch) configured to make a latch operation upon the receipt of a latch signal aCLK, for example, it is assumed that at least one inverter logic circuit is replaced with a clocked inverter logic circuit in a latch circuit configured in a ring shape by mutually connecting an input terminal and an output terminal of two inverter logic circuits, and the latch signal aCLK is input to this clocked gate.

Figure 6:
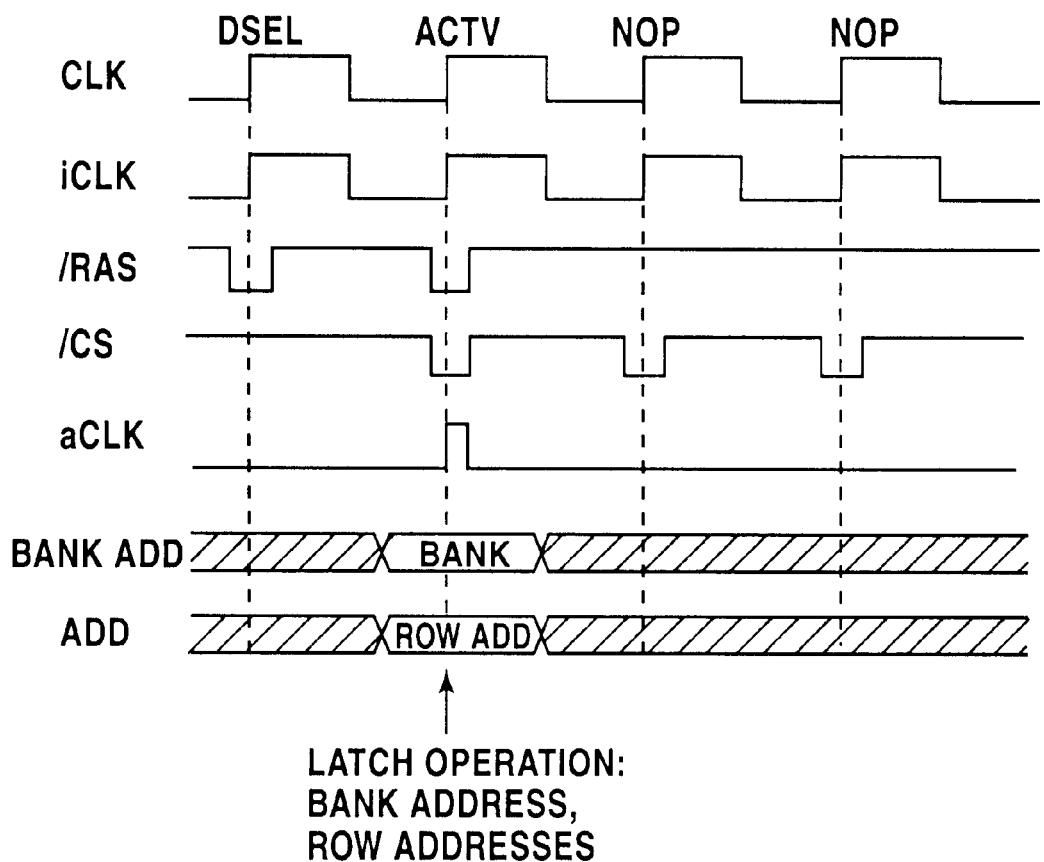
FIG. 6 is an operating waveform diagram of an input buffer circuit in the first embodiment.

Here, an input signal to be latched in the first embodiment is an address related signal, and a combination of control signals (Control) for a control logic circuit (Control Circuit) to output a latch signal aCLK can be limited to an active command (ACTV) cycle for SDRAM to require input from an address pin; a read command (READ, READA) cycle, a write command (WRITE, WRITEA) cycle, a mode register command (MRS) cycle, a pre-charge command (PRE) cycle or the like. FIG. 6 is a diagram showing operating waveforms before and after an active command (ACTV) cycle. In an active command (ACTV) cycle in which /CS and /RAS go to a low level, a control logic circuit (Control Circuit) outputs a latch signal aCLK in synchronism with a rising edge of a synchronous signal iCLK based on transition of /CS and /RAS, and latches address related signals BankAdd and Add as a bank address and row addresses in the same synchronous cycle.

Following the active command (ACTV) cycle, prior to receipt of a read command (READ, READA) cycle or write command (WRITE, WRITEA) cycle (not shown), a non-operation (NOP) cycle in which only /CS goes to a low level is properly inserted in order to wait for a time for sensing amplifier activation inside an SDRAM. However, address related signals BankAdd and Add during this period are unstable. Thus, a latch signal aCLK is not output from the control logic circuit (Control Circuit), unnecessary address latch operation is not performed, and unnecessary current consumption does not occur.

In addition, in a deselect command (DSEL) cycle prior to an active command (ACTV) cycle as well, the address related signals BankAdd and Add are unstable, the latch signal aCLK is not output from the control logic circuit (Control Circuit), and unnecessary current consumption does not occur at this cycle.

Figure 7:
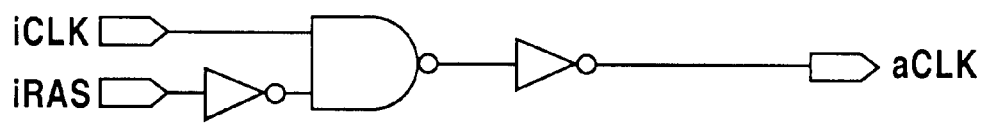
FIG. 7 is a circuit diagram showing a first specific example of a control logic circuit in the first embodiment.
Figure 8:
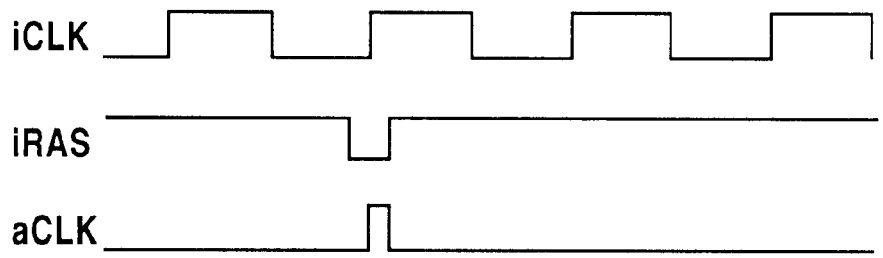
FIG. 8 is an operating waveform diagram showing a first specific example of a control logic circuit in the first embodiment.
Figure 9:
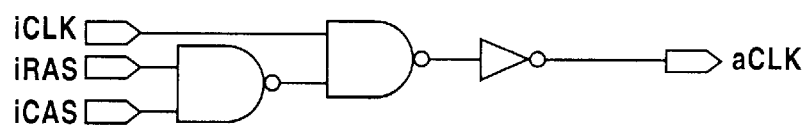
FIG. 9 is a circuit diagram showing a second specific example of a control logic circuit in the first embodiment.
Figure 10:
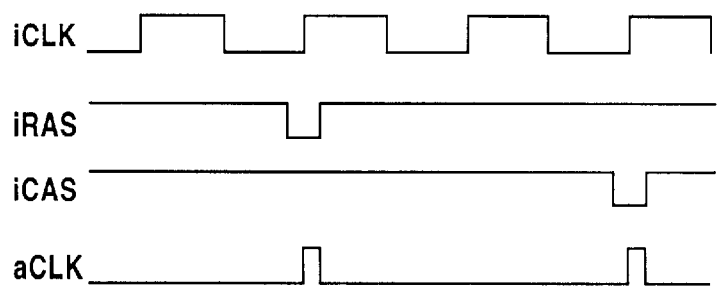
FIG. 10 is an operating waveform diagram showing a second specific example of the control logic circuit in the first embodiment.

FIG. 7 and FIG. 8 show a first specific example and FIG. 9 and FIG. 10 show a second specific example of the control logic circuit (Control Circuit).

In the first specific example, as shown in FIG. 7, the result obtained by logically computing a level converter circuit output iCLK of a synchronous signal CLK and an inverting signal of a level converter circuit output iRAS of /RAS in the NAND logic circuit is inverted to make a latch signal aCLK. As shown in FIG. 8, when an iRAS signal enters a low level at the rising edge of an iCLK signal, a high level pulse shaped latch signal aCLK is output.

Only in the case where attention is paid to only a low level signal /RAS at the rising edge of the synchronous signal CLK, the address related signals BankAdd and Add are latched. That is, a latch operation of the address related signals BankAdd and Add is performed for an active command (ACTV) cycle or pre-charge command (PRE) cycle so as to acquire row addresses, and for a mode register set command (MRS) cycle to set a mode register.

A second specific example, as shown in FIG. 9, shows a configuration in which the result obtained by logically computing a level converter circuit output iCLK of a synchronous signal CLK and a NAND logic output of /RAS and /CAS level converter circuit output iRAS and iCAS by a NAND logic circuit is inverted to produce a latch signal aCLK. As shown in FIG. 10, when a signal iRAS or iCAS is set at a low level, a high level pulse shaped latch signal aCLK is outputted to a rising edge of the signal iCLK.

In the case where at least one of the signals /RAS and /CAS is set at a low level, address related signals BankAdd and Add are latched at the rising edge of the synchronous signal CLK. That is, a latch operation of address related signals BankAdd and Add is performed during an active command (ACTV) cycle or a pre-charge command (PRE) cycle and the like for acquiring row addresses in order to activate word lines in which the signal /RAS is set at a low level, a read command (READ, READA) cycle or a write command (WRITE, WRITEA) cycle and the like for acquiring column addresses in order to activate column selection lines in which the signal /CAS is set at a low level, a mode register set command (MRS) cycle for setting a mode register in which the signals /RAS and /CAS are set at a low level.

According to the first embodiment, a combination of control signals (Control) such as /CS, /RAS, /CAS, or /WE causes a latch operation to be dynamically performed only in a command cycle in which SDRAM such as an active command (ACTV) cycle, read command (READ, READA) cycle, a write command (WRITE, WRITEA) cycle, a mode register command (MRS) cycle or a pre-charge command (PRE) cycle requires input from an address pin. Thus, when a signal level is unstable, latch data inversion due to unnecessary latch operation caused by a synchronous signal does not occur. In a normal operating state instead of a device pause state such as power-down mode using a CKE pin or the like as well, a through current in a latch circuit (Latch) caused by data inversion or a charge/discharge current of an output signal line of the latch circuit (Latch) and the like can be reduced to the required minimum.

In addition, in comparison with the prior art shown in FIG. 1, in the first embodiment shown in FIG. 5, to a latch circuit (Latch) of bank address BankAdd and address Add, an output signal aCLK of a control logic circuit (Control Circuit) is input as a latch signal instead of an internal synchronous signal int. CLK. Therefore, there is no need to connect an internal synchronous signal int. CLK to latch circuits (Latch) related to an address related signals, and a drive load of the internal synchronous signal int. CLK can be reduced. At the same time, the driving capability of the internal synchronous signal int. CLK can be restricted to the required minimum. By way of showing an example a 64 megabit SDRAM, an address related signals are 14 bits in size, which includes the bank address BankAdd. In response to a increased number of bits which will be caused by an increased capacity in size or an increased operating frequency caused by high speed operation, there is provided a significant effect of reduction of a charge or discharge current caused by reduction of the drive load or driving capability of the internal synchronous signal int. CLK.

Further, with respect to a level converter circuit (Level Converter), unlike the first prior art (Japanese Laid-open Patent Publication No. 11-273341) in which the converter circuit moves alternately between an inactive state and an active state for each synchronous signal or the second prior art (Japanese Laid-open Patent Publication No. 7-177015) in which the converter is inactive during burst reading or the like, an active state is always maintained in a normal operating state. Thus, there is no need for operation to move the converter from the inactive state to the active state, and low current consumption can be obtained while the active state is maintained. In the first embodiment as well, low current consumption can be achieved while high speed response properties are maintained for an input signal.

Figure 11:
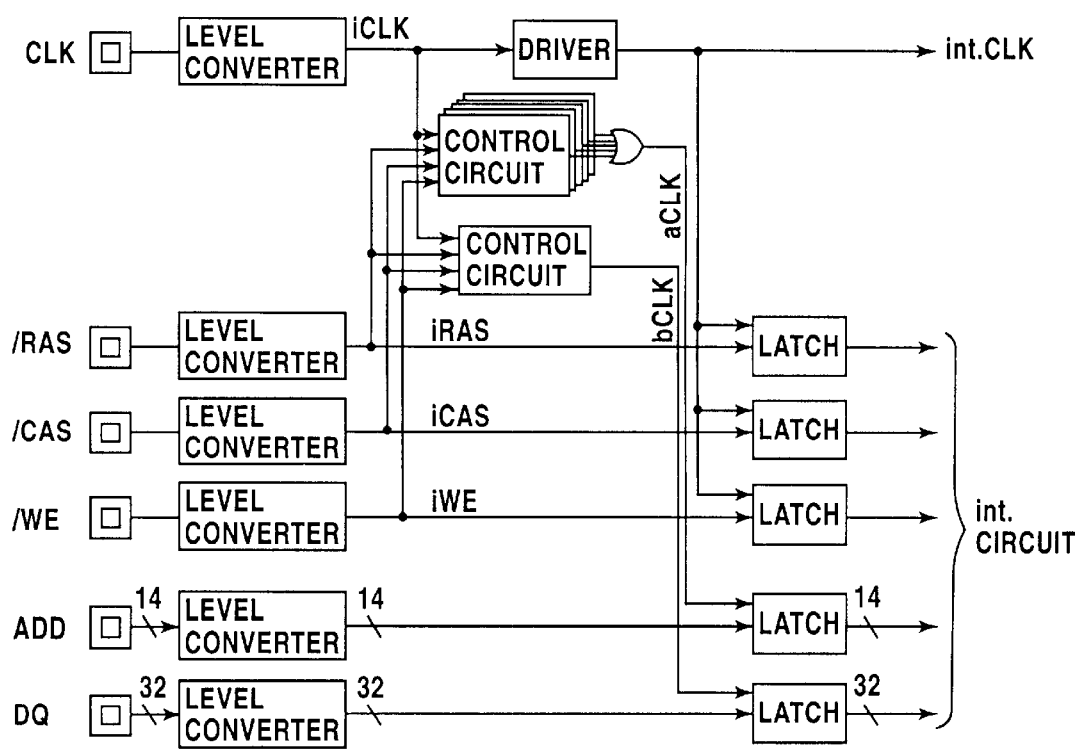
FIG. 11 is a block diagram depicting an input buffer circuit in the second embodiment.

Next, in the second embodiment shown in FIG. 11, in addition to a control logic circuit (Control Circuit) for outputting a latch signal aCLK that latches address related signals BankAdd and Add, there is provided a control logic circuit (Control Circuit) for outputting a latch signal bCLK that latches a data DQ or write mask signal DQM.

A latch signal aCLK is output in a cycle in which the address related signals BankAdd and Add are to be latched as in the first embodiment. In the second embodiment the control logic circuit (Control Circuit) is configured for each command cycle such as an active command (ACTV) cycle, a read command (READ, READA) cycle, a write command (WRITE, WRITEA) cycle, a mode register command (MRS) cycle, or pre-charge command (PRE) cycle with control signals iCLK, iRAS, and iWE being input signals as required. Individual control logic circuits (Control Circuit) outputs a latch signal according to each command cycle, and latches address related signals BankAdd and Add in a command cycle.

A latch signal bCLK is output in a data input (write) cycle such as data DQ or write mask signal DQM, and the latch signal bCLK is output in a write command (WRITE, WRITEA) cycle with each of the signals iCLK, iRAS, iCAS, or iWE being an input signal.

Here, a latch circuit (Latch) configured to perform a latch operation upon the receipt of latch signals aCLK and bCLK is configured such as to have two inverter logic circuits connected each other in a ring shape as in the first embodiment, wherein at least one inverter logic circuit is replaced with a clocked inverter logic circuit, and the latch signals aCLK and bCLK are input to this clocked gate.

Figure 12:
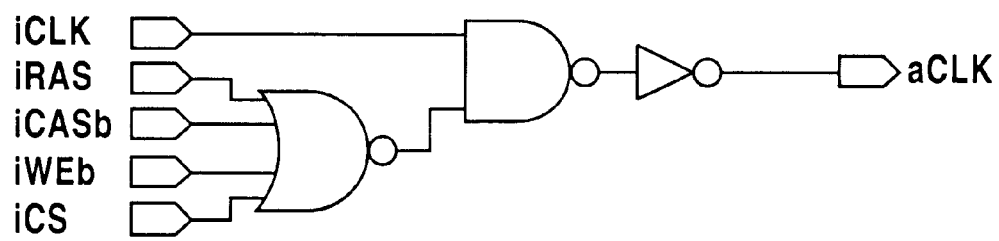
FIG. 12 is a circuit diagram showing a specific example of the control logic circuit in the second embodiment.
Figure 12:
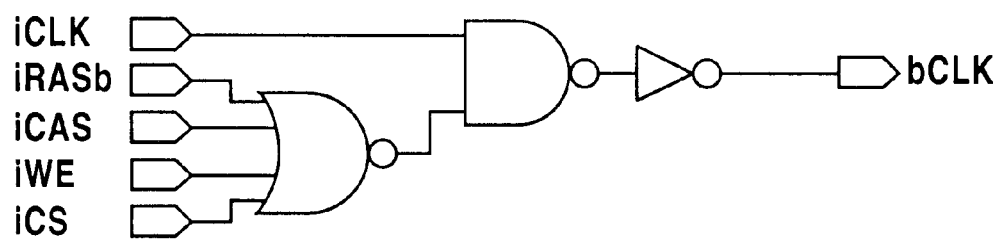
Figure 13:
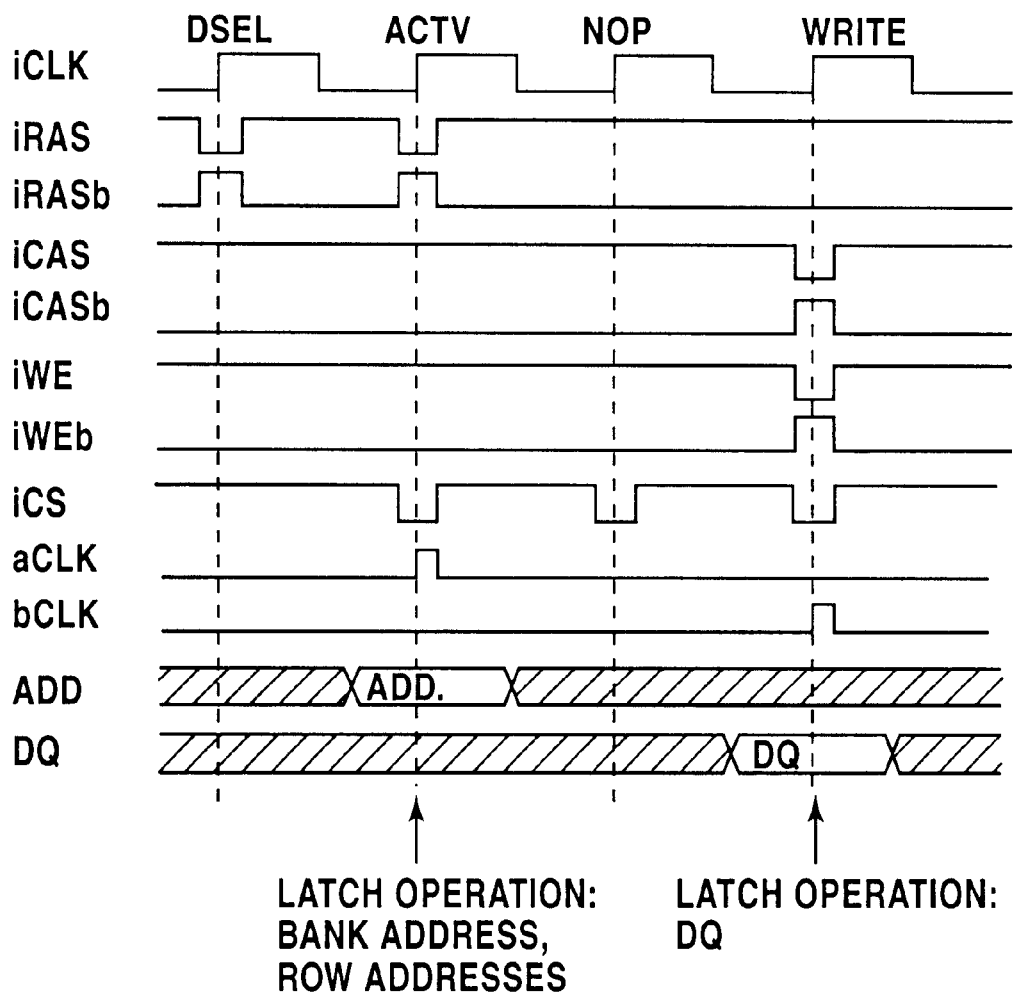
FIG. 13 is an operation waveform diagram of the input buffer circuit in the second embodiment.

Specific examples of the control logic circuit (Control Circuit) shown in FIG. 12 include a circuit for outputting a latch signal aCLK to an active command (ACTV) cycle and a circuit for outputting a latch signal bCLK to a write command (WRITE, WRITEA) cycle. FIG. 13 shows specific operating waveforms.

In an exemplary circuit for outputting a latch signal aCLK, in order to recognize an active command (ACTV) cycle and obtain a logic combination in which /CS and /RAS are active (low level), and /CAS and /WE are inactive (high level), /CS and /RAS level converter circuit outputs iCS and iRAS and /CAS and inverting signals iCASb and iWEb of the level converter circuit outputs /CAS and /WE are logically computed after received by a NOR logic circuit, and the result obtained by logically computing this output and the level converter circuit output iCLK of the synchronous signal CLK by NAND logic circuit is inverted, thereby producing a latch signal aCLK. A latch operation can be performed only in a command cycle in which an active command (ACTV) cycle is verified by means of the NOR logic circuit.

In an example of a circuit for outputting a latch signal bCLK, in order to recognize a write command (WRITE, WRITEA) cycle, iCS, iCAS, and iWE indicating an active state is input to the NOR logic circuit, and iRASb indicating an inactive state is input. Thus, the latch signal bCLK having inverted the NAND logic circuit result with iCLK is output only in a write command (WRITE, WRITEA) cycle.

FIG. 13 shows an operation sequence from an active command (ACTV) cycle to a write command (WRITE) cycle through a non-operation (NOP) cycle, following a deselect command (DSEL) cycle. In an active command (ACTV) cycle, a latch signal aCLK is output by means of a control logic circuit (Control Circuit) shown in FIG. 12. Then, address related signals BankAdd and Add are latched, and the latched signals are acquired as a bank address and row addresses. In a write command (WRITE) cycle, a latch signal bCLK is output, and data DQ or mask signal DQM and the like are latched.

In a deselect command (DSEL) cycle or a non-operation (NOP) cycle, the control logic circuit (Control Circuit) shown in FIG. 12 is not activated, and unnecessary latch operation does not occur.

In addition, in a read command (READ, READA) cycle, a write command (WRITE, WRITEA) cycle, a mode register command (MRS) cycle, and a pre-charge command (PRE) cycle or the like other than an active command (ACTV) cycle, a latch signal aCLK of the address related signals BankAdd and Add is output by individual control logic circuits (Control Circuit) (not shown).

Therefore, in a combination of control signals (Control) such as /CS, /RAS, /CAS, or /WE, individual control logic circuits (Control Circuit) output a latch signal aCLK to each command cycle such as active command (ACTV) cycle, read command (READ, READA) cycle, write command (WRITE, WRITEA) cycle, mode register command (MRS) cycle, or pre-charge command (PRE). Thus, the address related signals BankAdd and Add can be dynamically latched only in an operating cycle in which an input from address pins are required. In addition, data DQ or the like can be latched by means of a control logic circuit (Control Circuit) for dynamically outputting a latch signal bCLK only in a write command (WRITE, WRITEA) cycle. Thus, when a signal level is unstable, latch data inversion due to unnecessary latch operation caused by a synchronous signal does not occur. Instead of a device inactive state such as power-down mode using a CKE pin or the like, in a normal operating condition as well, a through current in a latch circuit (Latch) caused by latch data inversion or charge or discharge current or the like of the output signal line of the latch circuit can be reduced to the required minimum.

In addition, in a latch circuit (Latch) such as address related signals BankAdd and Add and data DQ, output signals aCLK and bCLK of the control logic circuit (Control Circuit) are input as latch signals instead of the internal synchronous signal int. CLK. Thus, a drive load of the internal synchronous signal int. CLK can be reduced. At the same time, the driving capability of the internal synchronous signal int. CLK can be restricted to the required minimum. By way of showing an example of 64 megabit SDRAM, in addition to a 14-bit address related signals containing a bank address BankAdd, an input buffer for inputting 32-bit data DQ are provided. In response to an increased number of bits caused by an increased capacity in size or an increase in operating frequency caused by high speed operation, there is provided a significant effect of reducing a charge/discharge current caused by reduction of the drive load or drive capability of the internal synchronous signal int. CLK.

Further, with respect to a level converter circuit (Level Converter), as in the first embodiment, an active state is always maintained in a normal operating state. Thus, there is no need to make operation for moving an inactive state to an active state, and low current consumption can be accelerated while an active state is maintained. In the second embodiment as well, low current consumption can be achieved while high speed response properties are maintained with respect to an input signal.

Figure 14:
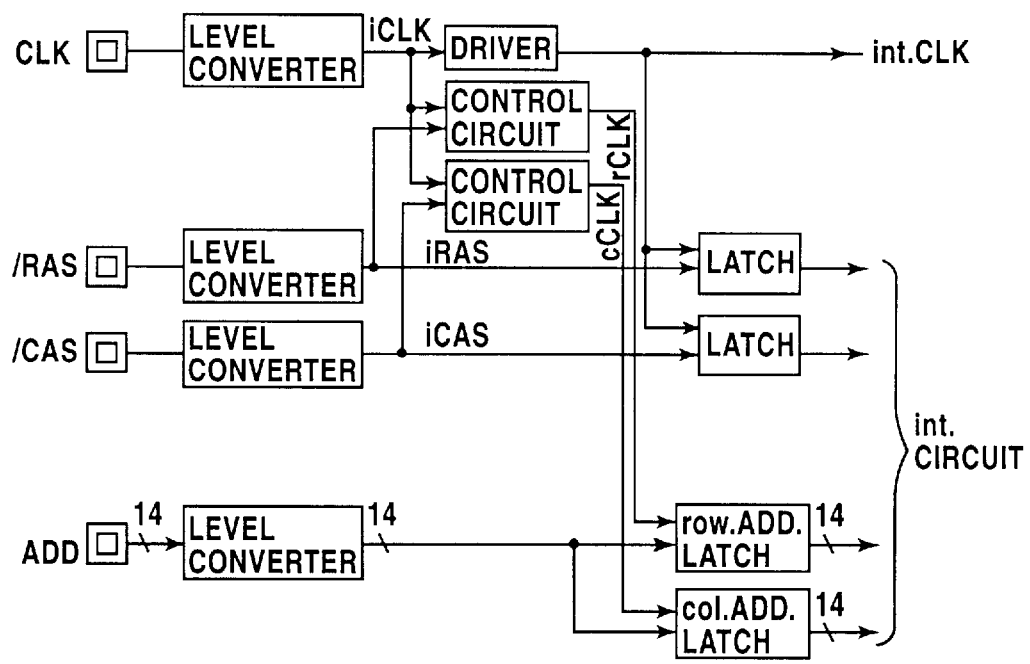
FIG. 14 is a block diagram depicting an input buffer circuit in a third embodiment.

Next, in the third embodiment shown in FIG. 14, latch circuits (Latch) for latching address related signals BankAdd and Add are provided separately as bank address BankAdd/row address latch circuits (Latch) and column address latch circuits (Latch). In addition, a control logic circuit (Control Circuit) for outputting a latch signal rCLK to the row address latch circuits (Latch) is provided so as to individually make a latch operation in operating conditions requiring the respective addresses Add, and a control logic circuit (Control Circuit) for outputting a latch signal cCLK is provided relevant to the column address latch circuits (Latch).

A latch signal rCLK is output in a cycle in which an address related signals BankAdd and Add are to be latched as a bank address BankAdd or row addresses. A control logic circuit (Control Circuit) configures control signals iCLK and iRAS as input signals to a command cycle such as active command (ACTV) cycle or pre-charge command (PRE) cycle. In the case where /RAS is set at a low level in synchronism with the rising edge of the synchronous signal CLK, the control logic circuit (Control Circuit) outputs the latch signal rCLK, latches the address related signals BankAdd and Add in the above command cycle, and acquires these signals in a bank address BankAdd or row address processing system.

Similarly, a latch signal cCLK is output in a cycle in which address related signals Add are to be latched as column addresses, and a control logic circuit (Control Circuit) is configured with the control signals iCLK and iCAS being input signals relevant to a command cycle such as read command (READ, READA) cycle or write command (WRITE, WRITEA) cycle. In the case where /CAS is set at a low level in synchronism with the rising edge of the synchronous signal CLK, the latch signal cCLK is output. The thus latched address related signals Add are acquired by column address processing system.

Here, as a latch circuit (Latch) configured to make a latch operation upon the receipt of the latch signals rCLK and cCLK, as in the first and second embodiments, it is assumed that at least one inverter logic circuit is replaced with a clocked inverter logic circuit in a latch circuit configured in a ring shape by connecting two inverter logic circuits so as to input the latch signals rCLK and cCLK to this clocked gate.

According to the third embodiment, each latch circuit (Latch) makes a latch operation for bank address BankAdd or row addresses by means of a latch signal rCLK or for column addresses by means of a latch signal cCLK. In the case where /RAS is set at a low level or in the case where the latch signal rCLK is output only to a command cycle such as active command (ACTV) cycle or pre-charge command (PRE) cycle, a latch operation can be dynamically performed. In the case where /CAS is set at a low level or in the case where the latch signal cCLK is output to a command cycle such as read command (READ, READA) cycle or write command (WRITE, WRITEA) cycle and the like, a latch operation can be dynamically performed. In any operating cycle other than these cycles, control logic circuits (Control Circuit) are not activated, and unnecessary latch operation does not occur. Instead of a device inactive state such as power-down mode utilizing a CKE pin or the like, in a normal operating state as well, a through current in a latch circuit (Latch) caused by latch data inversion or a charge/discharge current of a output signal line of a latch circuit (Latch) and the like can be reduced to the required minimum. Thus, low current consumption operation can be achieved, and high speed response properties can be ensured.

In addition, to the latch circuit (Latch), output signals rCLK and cCLK of the control logic circuit (Control Circuit) are inputted as latch signals instead of the internal synchronous signal int. CLK. Thus, the drive load of the internal synchronous signal int. CLK can be reduced. At the same time, the driving capability of the internal synchronous signal int. CLK can be restricted to the required minimum. Further, the latch circuits (Latch) are configured to be separated into the bank address BankAdd or row address processing system and column address processing system, and thus, the drive load of each latch circuit (Latch) can be reduced to the required minimum. By way of showing an example of a 64 megabit SDRAM, the above effect can be expected with respect to 14-bit address related signals BankAdd and Add including a bank address BankAdd. In response to a increased number of bits which will be caused by an increased capacity in size or an increased operating frequency caused by high speed operation, there is provided a significant effect of reduction of a charge or discharge current caused by reduction of the drive load or driving capability of the internal synchronous signal and driving load of the latch circuit of the address.

Further, as in the first and second embodiments, the level converter (Level Converter) circuit is always maintained to be active in a normal operating state. Thus, there is no need to make operation for moving an inactive state to an active state. Low current consumption can be accelerated while an active state is maintained. Low current consumption can be achieved while high speed response properties are maintained relevant to an input signal.

As has been described in detail, in the first embodiment, as shown in FIG. 5, output signals of the bank address BankAdd input circuit (Level Converter) and address Add input circuit (Level Converter) are latched by means of an output signal aCLK of the control logic circuit (Control Circuit). The latch signal aCLK is configured to output a high level pulse shaped signal (in the case of the first specific example shown in FIG. 7) at the rising edge of the signal iCLK when the signal iRAS is set at a low level. Alternatively, when the signal iRAS or iCAS is set at a low level at the rising edge of the signal iCLK, the signal aCLK is configured to output a high level signal (in the case of the second specific example shown in FIG. 9). Thus, in a combination of control signals (Control) such as /CS, /RAS, /CAS or /WE, a latch operation can be dynamically performed only in a command cycle in which an input from address pins are required such as active command (ACTV) cycle, read command (READ, READA) cycle, a write command (WRITE, WRITEA) cycle, a mode register command (MRS) cycle, or pre-charge command (PRE) cycle. If the signal level is unstable, latch data inversion due to unnecessary latch operation caused by the synchronous signal does not occur. Instead of a device inactive state such as power-down mode, in a normal operating state as well, a through current in a latch circuit (Latch) caused by latch data inversion or a charge/discharge current or the like of an output signal line of a latch circuit (Latch) can be reduced to the required minimum.

In addition, a latch signal aCLK is input to a latch circuit (Latch) of address related signals BankAdd and Add instead of the internal synchronous signal int. CLK. Thus, the driving load of the internal synchronous signal int. CLK can be reduced. At the same time, the driving capacity of the internal synchronous signal int. CLK can be restricted to the required minimum.

In response to a increased number of bits which will be caused by an increased capacity in size or an increased operating frequency caused by high speed operation, there is provided a significant effect of reduction of a charge or discharge current caused by reduction of the drive load or driving capability of the internal synchronous signal int. CLK.

Further, the level converter circuit (Level Converter) is always maintained to be active in a normal operating state. Thus, there is no need to make operation for moving an inactive state to an active state during signal input. Low current consumption can be accelerated while an active state is maintained. Low current consumption can be achieved while high speed response properties are maintained relevant to an input signal.

In the second embodiment, as shown in FIG. 11, in addition to the latch signal aCLK of address related signals BankAdd and Add, there is provided a control logic circuit (Control Circuit) for outputting the latch signal bCLK of data DQ or write mask signal DQM.

In a combination of control signals (Control) such as /CS, /RAS, /CAS, or /WE, individual control logic circuits (Control Circuit) output a latch signal aCLK to each command cycle such as active command (ACTV) cycle, read command (READ, READA) cycle, write command (WRITE, WRITEA) cycle, mode register command (MRS) cycle, or pre-charge command (PRE) cycle. Thus, the address related signals BankAdd and Add can be dynamically latched only in an operating cycle in which an input from address pins are required. In addition, data DQ or the like can be latched by means of a control logic circuit (Control Circuit) for dynamically outputting a latch signal bCLK only in a write command (WRITE, WRITEA) cycle. Thus, when a signal level is unstable, latch data inversion due to unnecessary latch operation caused by a synchronous signal does not occur. Instead of a device inactive state such as power-down mode using a CKE pin or the like, in a normal operating condition as well, a through current in a latch circuit (Latch) caused by latch data inversion or charge or discharge current or the like of the output signal line of the latch circuit can be reduced to the required minimum.

In addition, in a latch circuit (Latch) such as address related signals BankAdd and Add and data DQ or the like, output signals aCLK and bCLK of the control logic circuit (Control Circuit) are input as latch signals instead of the internal synchronous signal int. CLK. Thus, a drive load of the internal synchronous signal int. CLK can be reduced. At the same time, the driving capability of the internal synchronous signal int. CLK can be restricted to the required minimum. In response to an increased number of bits caused by an increased capacity in size or an increase in operating frequency caused by high speed operation, there is a significant effect of reducing a charge/discharge current caused by reduction of the drive load or drive capability of the internal synchronous signal int. CLK.

Further, with respect to a level converter circuit (Level Converter), an active state is always maintained in a normal operating state. Thus, there is no need to make operation for moving an inactive state to an active state, and low current consumption can be accelerated while an active state is maintained. In the second embodiment as well, low current consumption can be achieved while high speed response properties are maintained with respect to an input signal.

In the third embodiment, as shown in FIG. 14, latch circuits (Latch) for latching address related signals BankAdd and Add are provided separately as bank address BankAdd/ row address latch circuits (Latch) and column address latch circuits (Latch). In addition, a control logic circuit (Control Circuit) for outputting a latch signal rCLK to the row address latch circuits (Latch) is provided so as to individually make a latch operation in respective operating conditions. A latch signal rCLK is output only to a command cycle such as a cycle in which /RAS is set at low level or active command (ACTV) cycle and pre-charge command (PRE) cycle, and a latch operation is dynamically performed. A latch signal cCLK is output only to a command cycle such as a cycle in which /CAS is set at a low level or read command (READ, READA) cycle and write command (WRITE, WRITEA) cycle, whereby a latch operation can be performed dynamically. Unnecessary latch operation does not occur. Instead of a device inactive state, in a normal operating state as well, a through current in the latch circuit (Latch) caused by latch data inversion or a charge/discharge current or the like of the output signal line of the latch circuit (Latch) can be reduced to the required minimum, and high speed response properties can be ensured together with low current consumption operation.

In addition, to the latch circuit (Latch), output signals rCLK and cCLK of the control logic circuit (Control Circuit) are input as latch signals instead of the internal synchronous signal int. CLK. Thus, the drive load of the internal synchronous signal int. CLK can be reduced. At the same time, the driving capability of the internal synchronous signal int. CLK can be restricted to the required minimum. Further, the latch circuits (Latch) are configured to be separated into the bank address BankAdd or row address processing system and column address processing system, and thus, the drive load of each latch circuit (Latch) can be reduced to the required minimum. By way of showing an example of a 64 megabit SDRAM, the above effect can be expected with respect to 14-bit address related signals BankAdd and Add including a bank address BankAdd. In response to a increased number of bits which will be caused by an increased capacity in size or an increased operating frequency caused by high speed operation, there is provided a significant effect of reduction of a charge or discharge current caused by reduction of the drive load or driving capability of the internal synchronous signal.

Further, the level converter circuit (Level Converter) is always maintained to be active in a normal operating state. Thus, there is no need to make operation for moving an inactive state to an active state. Low current consumption can be accelerated while an active state is maintained. Low current consumption can be achieved while high speed response properties are maintained relevant to an input signal.

The present invention is not limited to the above described embodiments, and, of course, various modification or variation can occur without departing the spirit of the present invention.

In the present embodiments, although there is shown a configuration in which an output signal of a level converter circuit (Level Converter) is defined as an input signal of a control logic circuit (Control Circuit), an output signal of the level converter circuit (Level Converter) can be configured to be input to the control logic circuit (Control Circuit) when a signal latched by the latch circuit (Latch) is defined as an input signal.

In this manner, while the driving capability of an output signal of the level converter circuit (Level Converter) is restricted to the required minimum, thereby reducing current consumption, a signal latched by the latch circuit (Latch) having its sufficient driving capability in logical computation of the control logic circuit (Control Circuit) can be input as an input signal, and operation in the control logic circuit (Control Circuit) can be reliably performed.

Figure 15:
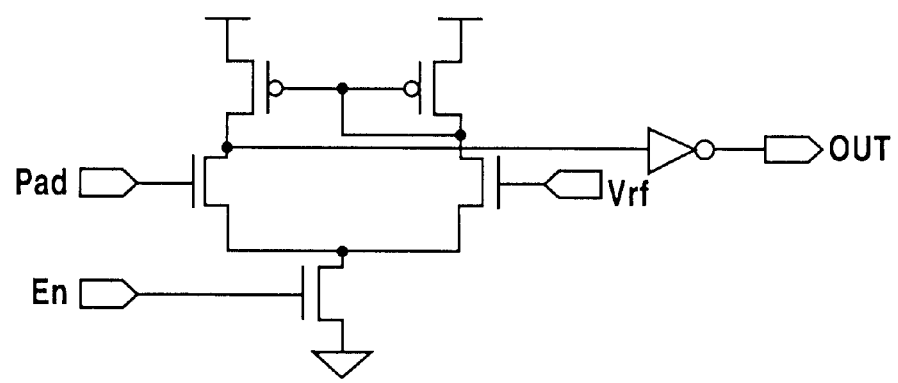
FIG. 15 is a circuit diagram showing a specific example of a level converter circuit.
Figure 16:
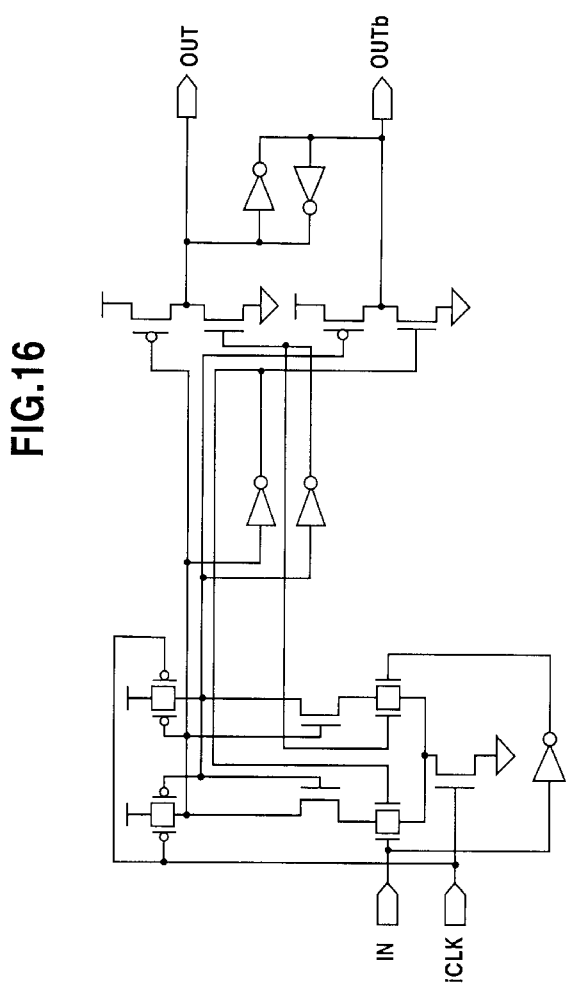
FIG. 16 is a circuit diagram showing a specific example of a latch circuit.

Although the present embodiments have described the level converter circuit (Level Converter) by way of showing an example of a differential amplification circuit system, as shown in FIG. 15, the level converter circuit (Level Converter) is not limited to this example. A circuit composed of a CMOS logic circuit or the like can be provided as an input circuit.

In addition, although a description has been given, assuming that a control signal configuring a command cycle is acquired in synchronism with the rising edge of the synchronous signal CLK, there can be provided a configuration in which the control signal is acquired in synchronism with the falling edge.

Further, although a description has been given with respect to a case in which an output of a latch signal in the latch circuit (Latch) is executed by a command based on a logical combination of control signals such as /CS, /RAS, /CAS, or /WE the configuration is not limited to this, but there can be provided a configuration in which the latching operation is performed by at least one control signal.

In the present embodiments, although a description has been given by way of showing an example of a 64 megabit synchronous random access memory (SDRAM), the present invention is applicable to a variety of synchronous semiconductor memory apparatuses such as static RAM or flash memory similarly without being limited to the random access memory. In addition, the present invention is applicable irrespective of whether a storage capacity is large or small in size.

According to the present invention, an input buffer circuit is activated only at an operating cycle required in a normal operating state without degrading high speed response properties of an input buffer, whereby unnecessary current consumption can be reduced, and low current consumption can be accelerated while high speed response properties is maintained relevant to an input signal.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A synchronous semiconductor memory apparatus, comprising:
   a first input circuit receiving a synchronous signal;
   one or more second input circuits receiving a control signal; and
   a plurality of third input circuits receiving input information including addresses or data for an access to individual memory cells,
   a logic circuit receiving an output signal of the first input circuit and an output signal of at least any one of the one or more second input circuits as an input signal; and
   first latch circuits for latching output signals of the third input circuits according to an output signal of the logic circuit.

2. A synchronous semiconductor memory apparatus according to claim 1, wherein the logic circuit comprises a detector circuit for detecting the output signal of the first input circuit and a logical computation circuit for checking that the output signal of at least any one of the second input circuits conforms to predetermined conditions when the output signal of the first input circuit is detected by means of the detector circuit, the first latch circuit comprises an activation circuit for activating a latch operation by inputting an output signal of the logical computation circuit, and output signals of the third input circuits are latched based on the fact that it is checked that the logical computation circuit conforms to the predetermined conditions to drive the activation circuit.

3. A synchronous semiconductor memory apparatus according to claim 1, wherein output signals of the third input circuits latched in the first latch circuits based on output signals of the first and second input circuits are input information including the addresses or data input to the third input circuits when the synchronous signal is input to the first input circuit, and the latch operation completes in one cycle of the synchronous signal.

4. A synchronous semiconductor memory apparatus according to claim 1, wherein the apparatus comprises second latch circuits for latching output signals of the second input circuits, and output signals of the second input circuits input to the logic circuit are output signals of the second latch circuits.

5. A synchronous semiconductor memory apparatus according to claim 1, wherein, of the third input circuits, address input circuits to which the addresses are input comprises row address latch circuits and column address latch circuits independently, and further comprises a row address logic circuit for controlling a latch operation of the row address latch circuits and a column address logic circuit for controlling a latch operation of the column address latch circuits independently.

6. A synchronous semiconductor memory apparatus according to claim 1, wherein the control signals input to the second input circuits are /CS, /RAS, /CAS, or /WE.

7. A synchronous semiconductor memory apparatus according to claim 1, wherein the output signal of the logic circuit is directed to an active command, a read command, a write command, a pre-charge command, or a mode register set command.

8. A synchronous semiconductor memory apparatus according to claim 1, wherein the input information contains a write mask control signal, and the addresses contains a bank address.

9. A method for latching and controlling input information on a synchronous semiconductor memory apparatus comprising:
   a synchronous signal input step of inputting a synchronous signal;
   a control signal input step of inputting one or more control signals;
   an information input step of inputting input information including addresses or data for an access to individual memory cells;
   a logic step of receiving an output signal obtained in accordance with the synchronous signal input step and one or more output signals obtained in accordance with the control signal input step; and
   a first latch step of latching output signals obtained in accordance with the information input step according to an output signal obtained in accordance with the logic step.

10. A method for latching and controlling input information on a synchronous semiconductor memory apparatus according to claim 9, wherein the logic step comprises a detection step of detecting the output signal obtained in accordance with the synchronous signal input step; and a logical computation step of checking that one or more output signals obtained in accordance with the control signal input step conforms to predetermined conditions during the detection in accordance with the detecting step, and the first latch step comprises a latch activation step of latching output signals obtained in accordance with the information input step based on the fact that an output signal obtained in accordance with the logical computation step conforms to predetermined conditions.

11. A method for latching and controlling input information on a synchronous semiconductor memory apparatus according to claim 9, wherein the first latch step completes a latch operation of the output signals obtained in accordance with the information input step performed in parallel to the synchronous signal input step within one cycle of the synchronous signal input step.

12. A method for latching and controlling input information on a synchronous semiconductor memory apparatus according to claim 9, wherein the latching and controlling method comprises a second latch step of latching the output signals obtained in accordance with the control signal input step, and the output signals obtained in accordance with the control signal input step to be input to the logic step are output signals obtained in accordance with the second latch step.

13. A method for latching and controlling input information on a synchronous semiconductor memory apparatus according to claim 9, wherein the first latch step is executed in accordance with a proper combination of /CS, /RAS, /CAS, and /WE input in the control signal input step.

14. A method for latching and controlling input information on a synchronous semiconductor memory apparatus according to claim 9, wherein the first latch step is executed in the case where the output signal obtained in accordance with the logic step is an active command, a read command, a write command, a pre-charge command, or mode register set command.

15. A method for latching and controlling input information on a synchronous semiconductor memory apparatus according to claim 9, wherein the input information input in the information input step contains a write mask control signal, and the addresses contains a bank address.

* * * * *